Aug. 2, 1966 W. L. OATES 3,263,303

METHOD OF MAKING MODULES

Filed April 9, 1962 2 Sheets-Sheet 1

INVENTOR.
WILLIAM L. OATES
BY Morris A. Rabkin
ATTORNEY

METHOD OF MAKING MODULES

Filed April 9, 1962 2 Sheets-Sheet 2

INVENTOR.
WILLIAM L. OATES
BY
Morris Rabkin
ATTORNEY 3,263,303
Patented August 2, 1966

3,263,303

METHOD OF MAKING MODULES

William L. Oates, Bernardsville, N.J., assignor to Radio Corporation of America, a corporation of Delaware Filed Apr. 9, 1962, Ser. No. 186,161
3 Claims. (Cl. 29—155.5)

This invention relates generally to the art of making electronic modules, and more particularly to an improved method of making miniature modules of the type comprising an encapsulated stack of circuit wafers. The improved method of the present invention is particularly useful for manufacturing micromodules for use in apparatus where miniaturization, high reliability, and efficiency are important considerations.

It has been proposed to make micromodules for electronic circuits, such as amplifying circuits, flip-flop circuits, detector circuits, and the like, by arranging a plurality of circuit wafers in a stack and electrically interconnecting the circuits on adjacent circuit wafers. Adjacent circuit wafers in each stack are spaced a predetermined distance from each other to provide for suitable electrical characteristics of the completed circuit and to insure that an even layer of encapsulant will surround each circuit wafer. Removable, spacing shims are customarily inserted between the circuit wafers during the process of manufacturing the module to provide the desired spacing. Since one circuit wafer may have a different overall thickness from an adjacent circuit wafer, and since the spacing shims are usually inserted between the corners of adjacent circuit wafers for easy removal, different size shims are usually used to space a plurality of circuit wafers properly in a stack. When the stack is assembled, wires are soldered to terminals on the circuit wafers to interconnect them. In order to insure reliably soldered joints, an operator works with the aid of a microscope and solders each joint separately by hand. After soldering, the metal spacer shims are removed, a process which is carried out very carefully to avoid breaking the relatively delicate circuit wafers and/or the small electrical components usually attached to the circuit wafers. The aforementioned prior art method of making modules is relatively slow and does not lend itself to the fast operation of dip soldering.

It is an object of the present invention to provide an improved method of making electronic modules that is relatively faster and more economical than the prior art methods.

Another object of the present invention is to provide an improved method of making micromodules that utilize soluble spacers for fixing the spaces between adjacent circuit wafers.

Still another object of the present invention is to provide an improved method of making modules that lend themselves easily to the operation of dip soldering.

A further object of the present invention is to provide an improved method of making modules than can be carried out by operators with very little training, with simple hand tools, and without the necessity of working with a microscope to provide an improved product at a relatively lower cost.

Briefly, the improved method of the present invention uses soluble spacers for fixing the distance between adjacent circuit wafers. A preferred method of making modules in accordance with the present invention employs the aid of a header jig for assembling circuit wafers each having a periphery with notched, metalized terminals on the periphery, straight riser wires, and soluble spacers. The straight riser wires are arranged in substantially parallel alignment in the jig to form a cage-like structure, open at the top, and to receive an interleaved stack of circuit wafers and spacers snugly therein. Each circuit wafer in the stack is separated from its adjacent wafer by a spacer soluble in a fluid that is inert to the circuit wafers and to the components usually fixed to the circuit wafers. In one embodiment of the invention, at least two straight risers with hooked, upper ends are inserted into the header jig, and the hooked ends are forced against the topmost circuit wafer of the interleaved stack to compress the stack so that the alternated wafers and spacers will be in firmly abutting relation. The stack is compressed gently to accomplish abutting relation between the respective wafers and spacers, after which the hookless riser wires are preferably pushed down into the jig to bring their outer or upper, free ends flush with the topmost circuit wafer. The riser wires are soldered to the metalized terminals on the periphery of the circuit wafers by the dip soldering technique. After soldering, the stack assembly is agitated back and forth in a suitable solvent to dissolve the soluble spacers. The stack assembly and portions of the riser wires may then be encapsulated with any suitable encapsulant.

The novel features of the present invention, both as to its organization and methods of operation, as well as additional objects and advantages thereof, will be more readily understood from the following description, when read in connection with the accompanying drawing in which the same reference characters designate similar parts throughout, and in which FIG. 1 is a plan view of a circuit wafer of the type employed by the improved method of making modules in accordance with the present invention;

Figure 1:
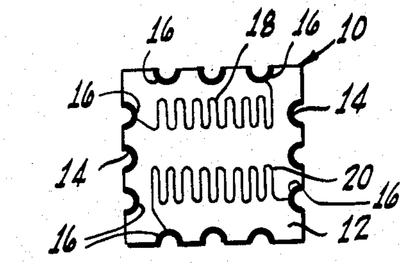
Figure 2:
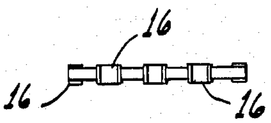
FIG. 2 is a side elevational view of the circuit wafer shown in FIG. 1.

Referring, now, particularly to FIGS. 1 and 2, there is shown a circuit wafer 10 of the type used in the improved method of making electrical modules. The circuit wafer 10 comprises a square sheet 12 of insulating material, such as alumina, formed with three notches 14 on each side. The surface adjacent to, and defining, the notches 14 is matalized to form metalized terminals 16 at the notches 14. An electrical component, such as a printed resistor 18, is disposed between two, selected ones of the metalized terminals 16. Another printed resistor 20 is also disposed between two other selected, metalized terminals 16.

Figure 3:
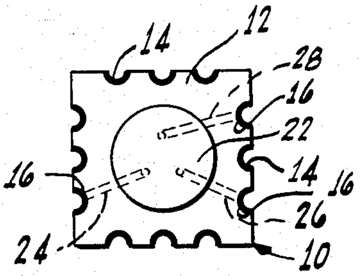
FIG. 3 is a plan view of another circuit wafer of the type used in constructing modules by the improved method of the present invention.
Figure 4:
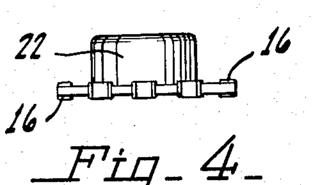
FIG. 4 is a side elevational view of the circuit wafer shown in FIG. 3.

FIGS. 3 and 4 also show a circuit wafer 10 with a transistor 22 disposed on one side of it. Three conductors 24, 26 and 28 which may be formed on the wafer 10 by the printed circuit technique connect the terminals of the transistor 22 to metalized terminals 16. It should be understood that each of the circuit wafers 10 may contain only some of the components and wiring connections of a desired, complete circuit, and that the complete circuit can be formed by electrically interconnecting the circuit wafers 10 in a predetermined order.

The improved methods of the present invention are particularly useful in interconnecting a plurality of circuit wafers 10 to form a desired circuit structure. To this end, a friction collet or header jig 30 is employed to position a plurality of straight riser wires 32 in substantially parallel alignment to form a cage-like structure, open at the top. The jig 30 comprises a substantially cylindrical member that may be easily held in the hand. The top, flat surface 34 of the jig 30 is formed with a plurality of openings 36 therein to receive the riser wires in substantially parallel alignment. The riser wires 32 may be held movably within the openings 36 of the jig 30 by any suitable friction means known in the art, as by suitably biased springs (not shown).

Figure 7:
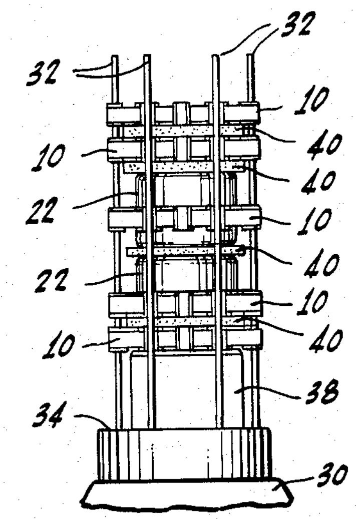
FIG. 7 is a somewhat enlarged, front elevational view of an interleaved stack of circuit wafers and soluble spacers within the cage-like structure formed by the riser wires.

Since, in the illustrated embodiment, all of the circuit wafers 10 have a substantially similar periphery, that is, since each circuit wafer 10 is formed with three notches 14 on each side of its square periphery, the holes 36 in the jig 30 are disposed to position each riser wire 32 within a notch 14 in each circuit wafer 10 when the circuit wafers 10 are stacked within the cage-like structure formed by the riser wires 32, as shown in FIG. 7. While the improved method of the present invention is not limited to the manufacture of micromodules employing square wafers with three notches on each side of their square peripheries, the improved method is described and illustrated with the aid of circuit wafers 10 of the type shown in FIGS. 1 and 3.

Figures 5, 6:
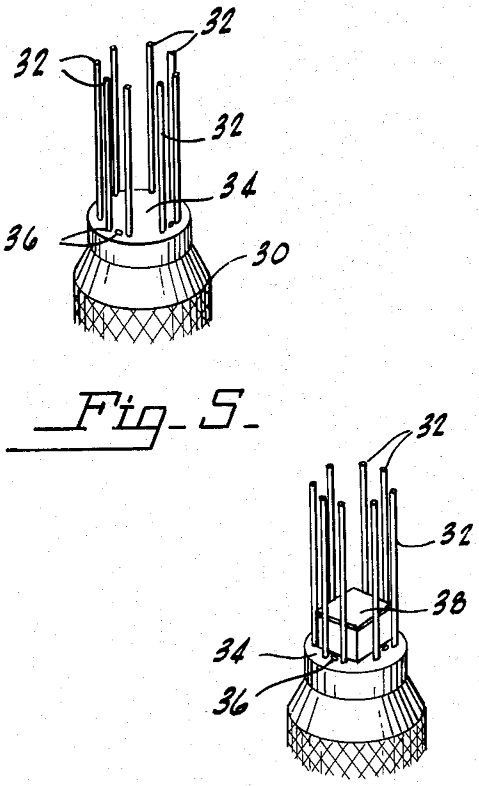
FIG. 5 is a perspective view of riser wires disposed in a header jig in one of the operations of the improved method of the present invention.
FIG. 6 is a view similar to that in FIG. 5 with the addition of a stand-off element within the cage-like structure formed by the riser wires.

Eight straight riser wires 32 are first assembled in the jig 30 so that each riser wire 32 will be engaged within a different notch 14 of the circuit wafers 10 adjacent to the four corners of the wafers when the latter are inserted into the cage-like structure formed by the wire risers 32. A stand-off block, such as a block 38 of "Teflon," is placed on the flat surface 34 within the cage-like structure, as shown in FIG. 6. Next, a plurality of circuit wafers 10, interleaved by, or alternated with, spacers 40 of insulating material between adjacent circuit wafers 10, are stacked within the cage-like structure, as shown in FIG. 7. The lowermost circuit wafer 10 rests on the stand-off block 38, and the uppermost circuit wafer 10 is initially below the upper ends of the riser wires 32. The circuit wafers 10 and spacers 40 are disposed perpendicularly to the riser wires 32, with each riser wire 32 engaged within a different notch 14 in each circuit wafer 10.

Each spacer 40 comprises a relatively thin disc of predetermined thickness and made of a filler of insulating material dispersed in a hardened binder that is soluble in a liquid which is inert to the circuit wafers 10 and to the electrical components affixed to the respective circuit wafers. A suitable spacer, for example, may comprise a disc formed from alumina or ceramic zircon powder suspended in hardened water-glass or a hardened resin, such as Butvar B–76 resin (Shawinigan Resin Corp., Springfield, Mass.). PC Freon (du Pont de Nemours & Co., Wilmington, Del.), alcohol, or water, may be suitable solvents for these spacers 40. In accordance with the present invention, even wafers of water-soluble "Aspirin" may be used for the spacer 40, where water is permissible as a cleaning fluid for the modules being manufactured.

Figure 8:
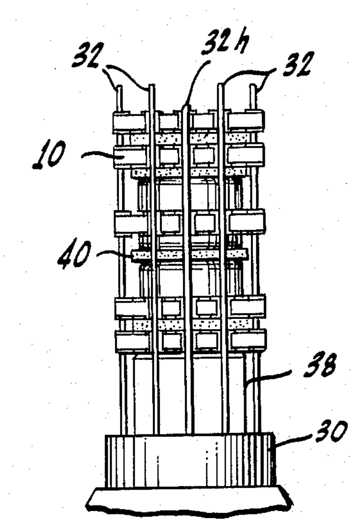
FIG. 8 is a view similar to FIG. 7 with the addition of hooked riser wires to hold the interleaved stack of circuit wafers and soluble spacers together.
Figure 9:
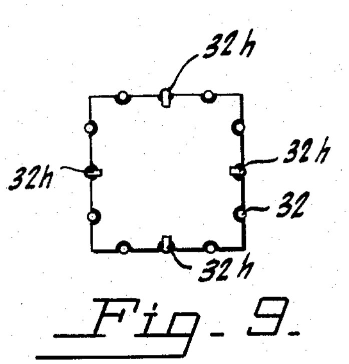
FIG. 9 is a top plan view of the interleaved stack shown in FIG. 8.

After the interleaved stacking of the circuit wafers 10 and spacers 40, the interleaved stack is held together more securely as a unit by the insertion of hook riser wires 32*h* (FIGS. 8 and 9) between adjacent riser wires 32 on each side of the square periphery of the circuit wafers 10. The upper end of each hook riser wire 32*h* is formed with a hook adapted to engage the uppermost circuit wafer 10 in the interleaved stack. All of the riser wires 32 are now pushed down into the jig 30 substantially flush with the top of the interleaved stack, as shown in FIG. 9. The jig 30 and the assembled, interleaved stack of circuit wafers 10 and spacers 40 can now be handled without fear of the interleaved stack shifting.

Figure 10:
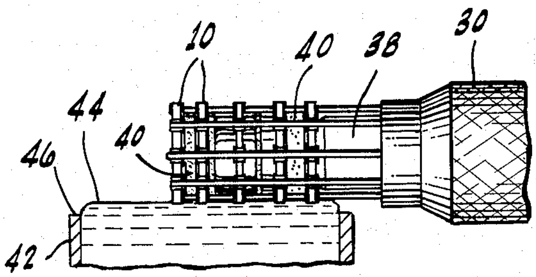
FIG. 10 is a side elevational view showing the interleaved stack of circuit wafers and spacers during the operation of dip soldering the riser wires to the metalized terminals of the circuit wafers.

One side of the interleaved stack, that is, two riser wires 32 and the hook riser wire 32*h* between them, can now be fluxed, as by a brush application of a suitable liquid solder flux. Next, the fluxed side of the interleaved stack is dipped for about three seconds into molten solder, the solder making contact with just the riser wires 32 and 32*h* and the adjacent terminals. Any suitable pot 42 of solder 44 may be used, the solder level being slightly higher than the edge 46 of the pot 42 by the nature of the meniscus formed by the solder. The surface of the solder 44 should be wiped to remove any dross thereon immediately before the dipping operation. The other three sides of the stack assembly can be soldered similarly by fluxing each side separately and by dipping the fluxed sides of the stack assembly successively in the solder 44, as shown in FIG. 10. During the dip-soldering operation, the riser wires 32 and 32*h* are soldered to their adjacent, metalized terminals 16 on the circuit wafers 10, thus interconnecting the circuit portions on the circuit wafers 10 to form a desired, complete circuit structure.

After the dip soldering operation, the spacers 40 are dissolved so as to leave the circuit wafers 10 properly spaced. To this end, the entire, soldered stack assembly is agitated in a fluid in which the spacers 40 are soluble. "PC Freon" is a good solvent for many resins, such as Butvar B–76, in which suitable, inert fillers may be suspended. This solvent may also be the cleaning fluid for removing excess soldering flux from the circuit wafers 10. Alcohol is another suitable solvent for spacer materials of hardened alcohol-soluble resins. A back and forth motion, that is, a reciprocating motion of the interleaved stack in the cleaning solvent has been found to be very effective for removing all of the spacer material from between adjacent circuit wafers 10.

Figure 11:
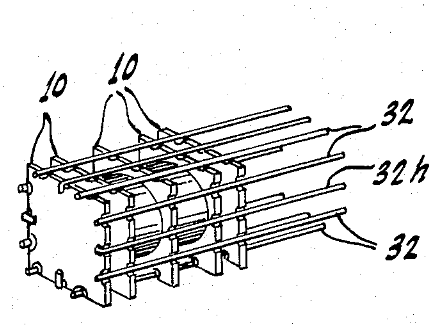
FIG. 11 is a perspective view of the circuit wafers soldered to the riser wires, the soluble spacers having been dissolved from between the circuit wafers.
Figure 12:
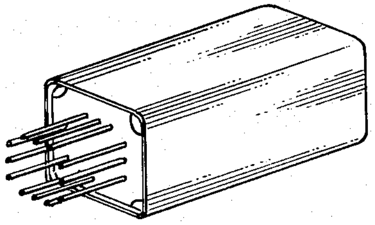
FIG. 12 is a perspective view of the completed, encapsulated module.

After the cleaning operation, the soldered stack of circuit wafers 10 (FIG. 11) is dried, as in an air blast, and encapsulated with any suitable encapsulant to form a finished structure, such as the encapsulated module shown in FIG. 12.

From the foregoing description, it will be apparent that there has been provided an improved method of making electrical modules with the aid of soluble spacers to fix the distances between adjacent circuit wafers. While the improved method of the invention has been described in connection with circuit wafers and soluble spacers of a particular configuration, variations in the method, utilizing circuit wafers and spacers of other configurations, whether identical or not in each case, will undoubtedly readily suggest themselves to those skilled in the art. Hence, it is desired that the foregoing shall be considered merely as illustrative and not in a limiting sense.

What is claimed is:

1. A method of making a module comprised of a plurality of circuit wafers each having at least one circuit component thereon and substantially similar periphery and metalized terminals on said periphery, first straight riser wires, second straight riser wires with hooked ends, and soluble spacers of insulating material, said method comprising the steps of:

(a) disposing said first straight riser wires in substantially parallel alignment to form a cage-like structure, open at the top, and adapted to receive a stack of wafers snugly therein through said open top,
(b) introducing said circuit wafers and said spacers through said open top in interleaved relation to form a stack thereof within said structure with said first riser wires adjacent to certain ones of said terminals,
(c) disposing at least two of said second straight riser wires with their hooked ends engaging the upper surface of the topmost circuit wafer in said interleaved stack with said second riser wires adjacent to other ones of said terminals,
(d) compressing said stack with said hooked ends of said second riser wires engaging the upper surface of the topmost circuit wafer in said interleaved stack,
(e) soldering said first and said second riser wires to adjacent ones of said terminals, and
(f) dissolving said spacers in a solvent.

2. A method of making a module comprised of a plurality of circuit wafers each having at least one circuit component thereon and substantially similar periphery and metalized terminals on said periphery, first straight riser wires, second straight riser wires with hooked ends, and soluble spacers of insulating material, said method comprising the steps of:
(a) disposing said first straight riser wires in substantially parallel alignment to form a cage-like structure, open at the top, and adapted to receive a stack of wafers snugly therein through said open top,
(b) introducing said circuit wafers and said spacers through said open top in interleaved relation to form a stack thereof within said structure with said first riser wires adjacent to certain ones of said terminals,
(c) disposing at least two of said second straight riser wires with their hooked ends engaging the upper surface of the topmost circuit wafer in said interleaved stack with said second riser wires adjacent to other ones of said terminals,
(d) compressing said stack with said hooked ends of said second riser wires engaging the upper surface of said topmost wafer,
(e) soldering said first and said second riser wires to adjacent ones of said terminal,
(f) dissolving said spacers in a solvent, and
(g) encapsulating said circuit wafers and said riser wires soldered thereto in an encapsulant.

3. A method of making a module with the aid of a jig, circuit wafers each having at least one circuit component thereon and a substantially similar periphery and metalized terminals on said periphery, first straight riser wires, second straight riser wires with hooked ends, and soluble spacers of insulating material, said method comprising the steps of
(a) disposing said first straight riser wires in said jig in substantially parallel alignment to form a cage-like structure, open at the top, and adapted to receive a stack of wafers snugly therein through said open top,
(b) introducing said circuit wafers and said spacers through said open top in interleaved relation to form a stack thereof within said structure with said first straight riser wires adjacent to certain ones of said terminals,
(c) inserting at least two of said second straight riser wires into said jig with their hooked ends engaging the upper surface of the topmost circuit wafer in said interleaved stack,
(d) compressing said stack with said hooked ends of said second riser wires engaging the upper surface of said topmost circuit wafer,
(e) dip soldering said first and said second riser wires to adjacent ones of said terminals,
(f) agitating said interleaved stack in a solvent inert to said circuit wafers and to said components until said spacers are dissolved, and
(g) encapsulating said circuit wafers and said riser wires soldered thereto in an encapsulant.

References Cited by the Examiner

UNITED STATES PATENTS

| | | | |
|---|---|---|---|
| 2,162,234 | 6/1939 | Thomas | 29—25.15 |
| 2,415,412 | 2/1947 | Buchwald et al. | 29—423 X |
| 2,771,663 | 11/1956 | Henry | 29—155.5 |
| 3,098,287 | 7/1963 | Buchsbaum | 29—155.5 |
| 3,153,751 | 10/1964 | Da Costa | 29—155.5 X |

FOREIGN PATENTS

| | | |
|---|---|---|
| 1,093,492 | 11/1960 | Germany. |
| 820,484 | 9/1959 | Great Britain. |
| 836,812 | 6/1960 | Great Britain. |

JOHN F. CAMPBELL, *Primary Examiner.*

WHITMORE A. WILTZ, *Examiner.*

L. TAYLOR, R. W. CHURCH, *Assistant Examiners.*